US009373733B2

(12) United States Patent
Iguchi

(10) Patent No.: US 9,373,733 B2
(45) Date of Patent: Jun. 21, 2016

(54) SEMICONDUCTOR LIGHT-RECEIVING DEVICE AND SEMICONDUCTOR LIGHT-RECEIVING DEVICE ARRAY

(71) Applicant: SUMITOMO ELECTRIC INDUSTRIES, LTD., Osaka (JP)

(72) Inventor: Yasuhiro Iguchi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/737,310

(22) Filed: Jun. 11, 2015

(65) Prior Publication Data
US 2015/0364618 A1    Dec. 17, 2015

(30) Foreign Application Priority Data

Jun. 16, 2014    (JP) .................................. 2014-123534

(51) Int. Cl.
H01L 31/00 (2006.01)
H01L 31/0232 (2014.01)
H01L 31/0203 (2014.01)
H01L 31/0304 (2006.01)
H01L 31/0352 (2006.01)
H01L 27/142 (2014.01)

(52) U.S. Cl.
CPC ........ H01L 31/02327 (2013.01); H01L 27/142 (2013.01); H01L 31/0203 (2013.01); H01L 31/02322 (2013.01); H01L 31/03046 (2013.01); H01L 31/035236 (2013.01)

(58) Field of Classification Search
CPC ............ H01L 27/142; H01L 27/14601; H01L 27/14643; H01L 31/02327; H01L 31/02322; H01L 31/035236; H01L 31/03046
See application file for complete search history.

(56) References Cited

U.S. PATENT DOCUMENTS

| 5,808,350 A * | 9/1998 | Jack ........................ G01J 5/10 257/184 |
| 8,809,985 B2 * | 8/2014 | Iguchi ............... H01L 31/02327 257/432 |
| 8,835,980 B2 * | 9/2014 | Hata ..................... H01L 27/142 257/183 |
| 2012/0074463 A1 * | 3/2012 | Hata ..................... H01L 27/142 257/184 |
| 2013/0292646 A1 * | 11/2013 | Iguchi ............... H01L 31/02327 257/21 |

FOREIGN PATENT DOCUMENTS

| JP | 2000-150923 | 5/2000 | |
| JP | 2012-160691 | 8/2012 | |
| WO | WO 2012/096239 | * 7/2012 | ............. H01L 31/10 |

* cited by examiner

Primary Examiner — Nikolay Yushin
(74) Attorney, Agent, or Firm — Smith, Gambrell & Russell, LLP.

(57) ABSTRACT

A semiconductor light-receiving device includes a substrate having a principal surface including first and second areas; a post disposed on the first area, the post including a semiconductor mesa; and a resin layer disposed on the second area in contact with a side surface of the post. The resin layer has, on a ray extending from a first point within the first area through a second point within the second area, a first thickness and a second thickness respectively at a third point and a fourth point that are located within the second area at different distances from the first point. The distance from the first point to the fourth point is larger than the distance from the first point to the third point. The first thickness is larger than the second thickness. The resin layer has a surface that monotonically changes from the first thickness to the second thickness.

20 Claims, 5 Drawing Sheets

SEMICONDUCTOR LIGHT-RECEIVING DEVICE AND SEMICONDUCTOR LIGHT-RECEIVING DEVICE ARRAY

BACKGROUND OF THE INVENTION

1. Field of the Invention

The present invention relates to a semiconductor light-receiving device and a semiconductor light-receiving device array including a plurality of semiconductor light-receiving devices arranged two-dimensionally.

2. Description of the Related Art

Patent Literature 1 (Japanese Unexamined Patent Application Publication No. 2000-150923) and Patent Literature 2 (Japanese Unexamined Patent Application Publication No. 2012-160691) disclose back-illuminated type light-receiving devices.

The back-illuminated type light-receiving device described in Patent Literature 1 includes a semiconductor light-receiving device and one or more oblique-surface reflection portions having the shape of a recess that are disposed on a substrate, the oblique-surface reflection portions being formed separately from the semiconductor light-receiving device. The semiconductor light-receiving device includes a semiconductor mesa. The semiconductor mesa of the semiconductor light-receiving device includes an optical absorption layer. Signal light entered the substrate through the back surface of the substrate, is reflected by the oblique-surface reflection portion. The reflected light enters the semiconductor light-receiving device at an oblique angle.

SUMMARY OF THE INVENTION

The semiconductor light-receiving device including a semiconductor mesa has relatively large dark currents flowing through the optical absorption layer and a side surface of the optical absorption layer in the semiconductor mesa. In order to reduce the dark current, reduction in the area of the section and the area of the side surface of the optical absorption layer in the semiconductor mesa is effective. However, reduction in the size of the optical absorption layer causes a sensitivity degradation of the semiconductor light-receiving device.

A semiconductor light-receiving device according to an aspect of the present invention includes a substrate having a principal surface including a first area and a second area surrounding the first area; a post disposed on the first area of the substrate, the post including a semiconductor mesa including an optical absorption layer; and a resin layer disposed on the second area of the substrate, the resin layer being in contact with a side surface of the post. The resin layer has, on a ray extending from a first point within the first area through a second point within the second area, a first thickness and a second thickness respectively at a third point and a fourth point that are located on the ray within the second area at different distances from the first point. The distance from the first point to the fourth point is larger than the distance from the first point to the third point. The first thickness at the third point is larger than the second thickness at the fourth point. In addition, and the resin layer has a surface that monotonically changes from the first thickness to the second thickness, in a section of the resin layer, the section being defined by a reference plane that passes the ray and extends along an axis normal to the principal surface of the substrate.

A semiconductor light-receiving device array according to another aspect of the present invention includes a substrate having a principal surface; a plurality of semiconductor light-receiving devices arranged two-dimensionally on the principal surface of the substrate; and a device isolation region disposed among the semiconductor light-receiving devices, the device isolation region separating the semiconductor light-receiving devices from each other. Each of the semiconductor light-receiving devices includes first and second areas in the principal surface of the substrate, the second area surrounding the first area; a post disposed on the first area, the post including a semiconductor mesa including an optical absorption layer; and a resin layer disposed on the second area, the resin layer being in contact with a side surface of the post. The resin layer has, on a ray extending from a first point within the first area through a second point within the second area, a first thickness and a second thickness respectively at a third point and a fourth point that are located on the ray within the second area at different distances from the first point. The distance from the first point to the fourth point is larger than the distance from the first point to the third point. The first thickness at the third point is larger than the second thickness at the fourth point. In addition, the resin layer has a surface that monotonically changes from the first thickness to the second thickness, in a section of the resin layer, the section being defined by a reference plane that passes the ray and extends along an axis normal to the principal surface of the substrate.

Objects, features, and advantages according to embodiments of the present invention will be more easily understood from the following detailed descriptions of preferred embodiments according to the present invention with reference to attached drawings.

DESCRIPTION OF THE PREFERRED EMBODIMENTS

Figure 1A:
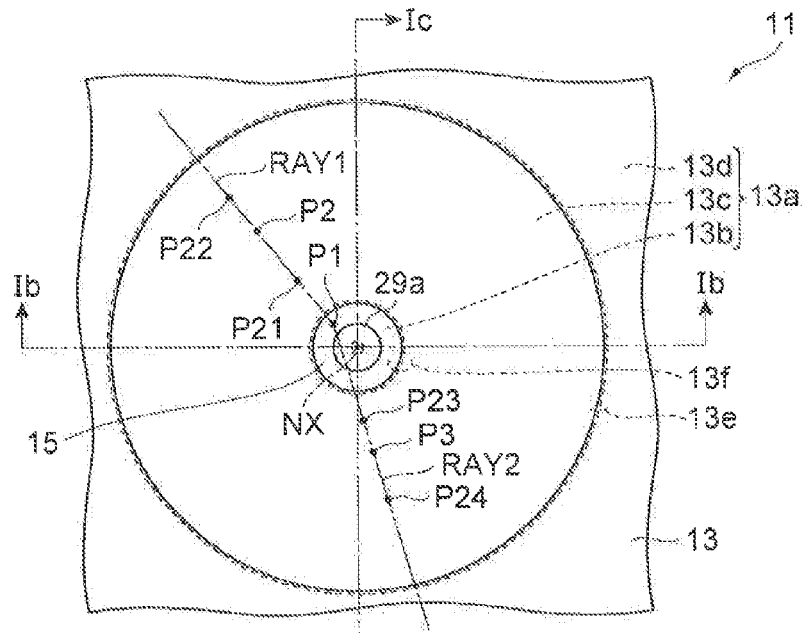
FIGS. 1A, 1B, and IC each illustrate a structure of a semiconductor light-receiving device according to an embodiment.

First, embodiments of the present invention will be listed and described.

A semiconductor light-receiving device according to an embodiment includes (a) a substrate having a principal surface including a first area and a second area surrounding the first area; (b) a post disposed on the first area of the substrate, the post including a semiconductor mesa including an optical absorption layer; and (c) a resin layer disposed on the second area of the substrate, the resin layer being in contact with a side surface of the post. The resin layer has, on a ray extending from a first point within the first area through a second point within the second area, a first thickness and a second thickness respectively at a third point and a fourth point that are located on the ray within the second area at different distances from the first point. The distance from the first point to the fourth point is larger than the distance from the first point to the third point. The first thickness at the third point is larger than the second thickness at the fourth point. In addition, the resin layer has a surface that monotonically changes from the first thickness to the second thickness, in a section of the resin layer, the section being defined by a reference plane that passes the ray and extends along an axis normal to the principal surface of the substrate.

In this semiconductor light-receiving device, the semiconductor mesa is disposed on the first area but not on the second area of the of the substrate. Accordingly, this semiconductor mesa has a smaller surface area than a semiconductor mesa that is disposed on both of the first area and the second area of the substrate. The resin layer is disposed on the second area of the substrate in contact with the side surface of the post. The resin layer has a surface that monotonically changes from the first thickness at the third point within the second area to the second thickness at the fourth point within the second area, in a section defined by the above-described reference plane. The distance from the first point to the fourth point is larger than the distance from the first point to the third point. Light passing the second area of the principal surface of the substrate is partially reflected by the surface of the resin layer and enters the optical absorption layer through the side surface of the post. As a result, the optical absorption layer in the post receives light passing the first area of the substrate and also receives a portion of light passing the second area of the substrate.

The semiconductor light-receiving device according to one embodiment may further include a metal layer formed on the surface of the resin layer. In this semiconductor light-receiving device, the metal layer enables an increase in reflectivity of the surface of the resin layer for light entering the resin layer through the second area of the substrate.

In the semiconductor light-receiving device according to one embodiment, the resin layer may contain a material that transmits light of wavelengths in a range of 0.7 μm to 3 μm.

In the semiconductor light-receiving device according to one embodiment, the resin layer preferably contains a fluororesin. In this semiconductor light-receiving device, the fluororesin transmits light having a wavelength in the near-infrared region with a sufficiently high transmittance.

In the semiconductor light-receiving device according to one embodiment, the post may include an inorganic insulating film formed on a side surface of the semiconductor mesa. In this semiconductor light-receiving device, the inorganic insulating film effectively protects the side surface of the semiconductor mesa.

In the semiconductor light-receiving device according to one embodiment, the optical absorption layer may include an InGaAs/GaAsSb type-II multi quantum well structure or an InGaAs layer.

In the semiconductor light-receiving device according to one embodiment, preferably, the substrate has a back surface receiving a signal light. The surface of the resin layer has a shape configured to reflect the signal light entering the resin layer through the substrate toward the semiconductor mesa.

A semiconductor light-receiving device array according to an embodiment includes a substrate having a principal surface; a plurality of semiconductor light-receiving devices arranged two-dimensionally on the principal surface of the substrate; and a device isolation region disposed among the semiconductor light-receiving devices, the device isolation region separating the semiconductor light-receiving devices from each other. Each of the semiconductor light-receiving devices includes first and second areas in the principal surface of the substrate, the second area surrounding the first area; a post disposed on the first area, the post including a semiconductor mesa including an optical absorption layer; and a resin layer disposed on the second area, the resin layer being in contact with a side surface of the post. The resin layer has, on a ray extending from a first point within the first area through a second point within the second area, a first thickness and a second thickness respectively at a third point and a fourth point that are located on the ray within the second area at different distances from the first point. The distance from the first point to the fourth point is larger than the distance from the first point to the third point. The first thickness at the third point is larger than the second thickness at the fourth point. In addition, the resin layer has a surface that monotonically changes from the first thickness to the second thickness, in a section of the resin layer, the section being defined by a reference plane that passes the ray and extends along an axis normal to the principal surface of the substrate.

The findings of the present invention can be easily understood from detailed descriptions below with reference to attached drawings illustrating examples. Hereinafter, embodiments relating to a semiconductor light-receiving device and a method for producing a semiconductor light-receiving device will be described with reference to attached drawings. When possible, like components are denoted by like reference numerals.

Figure 1B:
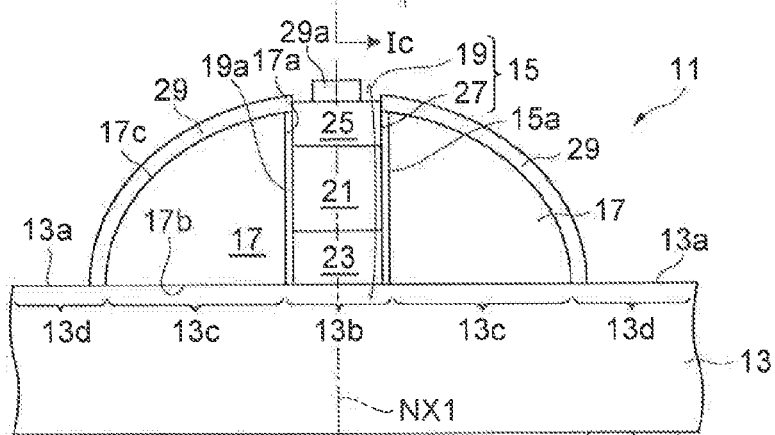
Figure 1C:
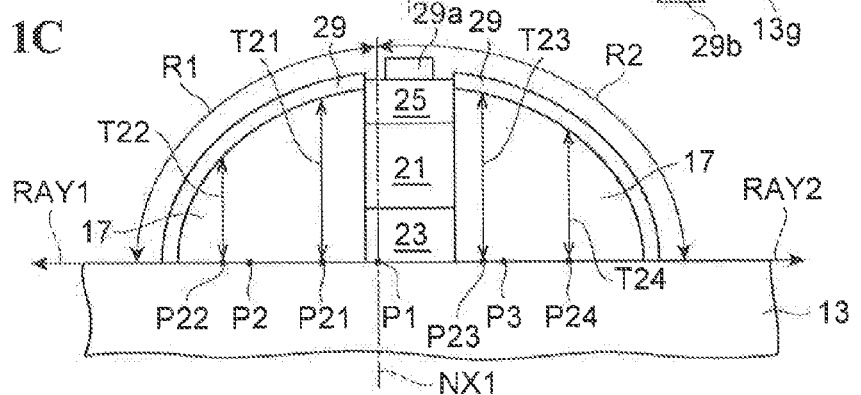
Figure 2:
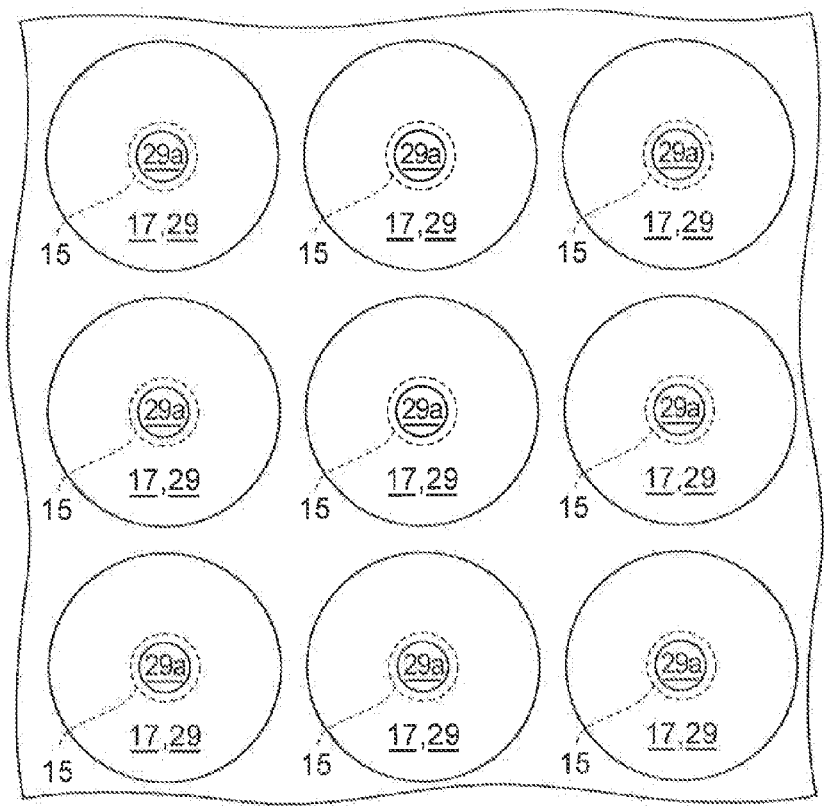
FIG. 2 illustrates a light-receiving device array including semiconductor light-receiving devices arranged two-dimensionally.

FIGS. 1A to 1C each illustrate a structure of a semiconductor light-receiving device according to an embodiment. FIG. 1A illustrates a plan view of the semiconductor light-receiving device 11. Referring to FIG. 1A, a semiconductor light-receiving device 11 includes a substrate 13, a post 15, and a resin layer 17. The substrate 13 has a principal surface 13a that includes a first area 13b, a second area 13c, and a third area 13d. The third area 13d surrounds the second area 13c. The second area 13c surrounds the first area 13b. In the principal surface 13a, the second area 13c is in contact with the third area 13d at a boundary 13e. The first area 13b is in contact with the second area 13c at a boundary 13f. In this embodiment, the first area 13b in the principal surface 13a has a circular shape. Alternatively, the first area 13b may have another shape of a square, a rhombus, a hexagon, or an octagon, for example. The second area 13c is a connection region that is disposed along the periphery of the first area 13b so as to surround the first area 13b. The second area 13c is an annular region that has a certain width and extends along a closed loop. In this embodiment, the inner periphery of the second area 13c has a circular shape. The outer periphery of the second area 13c has a circular shape. FIG. 2 illustrates a structure of a light-receiving device array according to an embodiment. Referring to FIG. 2, in the light-receiving device array, a plurality of semiconductor light-receiving devices 11 each of which has the first area 13b and the second area 13c are arranged two-dimensionally. The first areas 13b and the second areas 13c are device forming regions in which photodiodes are disposed. The third area 13d is a device isolation region located among the device forming regions. The plurality of semiconductor light-receiving devices 11 are electrically and physically separated from each other by the device isolation region. The substrate 13 is formed of a material that transmits light having wavelengths in the range of 0.7 μm to 3 μm. In this semiconductor light-receiving device, the substrate 13 does not substantially absorb light having these wavelengths in the range of 0.7 μm to 3 μm. Light passing through the substrate 13 enters the resin layer 17 or a semiconductor mesa 19 without being absorbed by the substrate 13.

FIG. 1B is a section taken along line Ib-Ib or line Ic-Ic, for example, in FIG. 1A. The post 15 is disposed on the first area 13b of the substrate 13. The resin layer 17 is disposed on the second area 13c of the substrate 13.

The post 15 includes the semiconductor mesa 19. The semiconductor mesa 19 includes an optical absorption layer 21 that absorbs light having wavelengths in the infrared region. That is, photocarriers are generated in the optical absorption layer 21 when light having wavelengths in the infrared region enters into the optical absorption layer 21. In the semiconductor mesa 19, the optical absorption layer 21 is disposed between a first semiconductor layer 23 of a first conductivity type (for example, n type) and a second semiconductor layer 25 of a second conductivity type (for example, p type). In this embodiment, the first semiconductor layer 23, the optical absorption layer 21, and the second semiconductor layer 25 are arranged in this order in a direction of an axis normal to the principal surface 13a of the substrate 13.

The resin layer 17 includes a first surface 17a, a second surface 17b, and a third surface 17c. The first surface 17a is in contact with a side surface 15a of the post 15. The second surface 17b is in contact with the second area 13c. The third surface 17c of the resin layer 17 is included in a surface that connects the periphery of the first surface 17a to the periphery of the second surface 17b. The third surface 17c has a shape configured to reflect light entering the resin layer 17 through the second area 13c toward the semiconductor mesa 19. The third surface 17c has a three-dimensional shape that is convex in an upward direction from the substrate 13 and along the post 15. The third surface 17c also has a two-dimensional shape that is convex in an upward direction from the substrate 13 and along the post 15 in a plane of intersection of a reference plane and the resin layer 17, the reference plane extending in a direction normal to the principal surface 13a of the substrate 13.

The resin layer 17 is formed of a material that transmits light of wavelengths in the range of 0.7 µm to 3 µm, for example. In this embodiment, the resin layer 17 contains a fluororesin. In this semiconductor light-receiving device 11, the fluororesin has a sufficiently large transmittance to light in the near-infrared region. Examples of the fluororesin include resins that have no CH bond in the structural formulas.

In this embodiment, the post 15 includes an inorganic insulating film 27. The inorganic insulating film 27 is formed on a side surface 19a of the semiconductor mesa 19. The side surface 15a of the post 15 corresponds to a surface of the inorganic insulating film 27. Therefore, the first surface 17a of the resin layer 17 is disposed on the inorganic insulating film 27 in contact with the inorganic insulating film 27. In the semiconductor light-receiving device 11, the inorganic insulating film 27 effectively protects the side surface 19a of the semiconductor mesa 19. The inorganic insulating film 27 contains a silicon based inorganic compound such as SiN or $SiO_2$.

In the semiconductor light-receiving device 11, the semiconductor mesa 19 receives incoming light that passes through the back surface of the substrate 13 in the first area 13b. The semiconductor mesa 19 also receives light that enters the resin layer 17 through the back surface of the substrate 13 in the second area 13c, and is then reflected by the third surface 17c of the resin layer 17.

In this semiconductor light-receiving device 11, the semiconductor mesa 19 is disposed on the first area 13b but not on the second area 13c. Accordingly, this semiconductor mesa has a smaller surface area (for example, the circumferential length of a cross section of the semiconductor mesa 19) than that of a semiconductor mesa that is disposed on both of the first area 13b and the second area 13c. Because dark currents mainly flow through the optical absorption layer and a side surface of the optical absorption layer in the semiconductor mesa, reduction in the area of the section and the area of the side surface of the optical absorption layer in the semiconductor mesa is effective to reduce the dark current. Therefore, the dark currents are reduced for the semiconductor light-receiving device 11 including the semiconductor mesa 19 having the smaller surface area.

As illustrated in FIG. 1A, a first ray RAY1 is extended from a first point P1 within the first area 13b through a second point P2 within the second area 13c. On the first ray RAY1, a fourth point P21 and a fifth point P22 are defined. The fourth point P21 and the fifth point P22 are located within the second area 13c. The distance from the first point P1 to the fifth point P22 is larger than the distance from the first point P1 to the fourth point P21. The resin layer 17 has a first thickness T21 at the fourth point P21 and a second thickness T22 at the fifth point P22. Here, the thickness of the resin layer 17 is defined as a distance from the principal surface 13a of the substrate 13 to the third surface 17c of the resin layer 17 in a direction along an axis NX normal to the principal surface 13a of the substrate 13. The third surface 17c of the resin layer 17 has a convex surface. The thickness of the resin layer 17 monotonically changes from the first thickness T21 to the second thickness T22, in a section of the third surface 17c, the section being defined by a reference plane passing through the first ray RAY1 and extending along the axis NX normal to the principal surface 13a of the substrate 13. The first thickness T21 is larger than the second thickness T22.

In the semiconductor light-receiving device 11, as described above, the semiconductor mesa 19 is disposed on the first area 13b but not on the second area 13c. Accordingly, the semiconductor mesa 19 has a smaller side-surface length than that of a semiconductor mesa that is disposed on both of the first area 13b and the second area 13c. The thickness of the resin layer 17 monotonically changes from the first thickness T21 at the fourth point P21 within the second area 13c to the second thickness T22 at the fifth point P22 within the second area 13c, in a section defined by the above-described reference plane. Light passing through the second area 13c of the principal surface 13a of the substrate is partially reflected by a surface of the resin layer 17 (for example, the third surface 17c) and enters the optical absorption layer 21 through the side surface 15a of the post 15. Thus, the optical absorption layer 21 within the post 15 receives light passing through the first area 13b of the principal surface 13a. In addition, the optical absorption layer 21 within the post 15 also receives a portion of light passing through the second area 13c of the principal surface 13a.

The semiconductor light-receiving device 11 further includes a metal layer 29 formed on an upper surface (third surface 17c) of the resin layer 17. In this semiconductor light-receiving device 11, the metal layer 29 increases reflectance for light entering the resin layer 17 through the second area 13c. The metal layer 29 is formed of gold or platinum, for example.

The semiconductor light-receiving device 11 includes a first electrode 29a and a second electrode 29b. The first electrode 29a is formed on the upper surface of the semiconductor mesa 19. The second electrode 29b is formed on a back surface 13g of the substrate 13 or on the third area 13d of the principal surface 13a of the substrate 13, for example. In this embodiment, the second electrode 29b is formed on the back surface 13g of the substrate 13.

Referring to FIG. 1A, a second ray RAY2 is extended from the first point P1 within the first area 13b through a third point P3 within the second area 13c. On the second ray RAY2, a sixth point P23 and a seventh point P24 are defined. The sixth point P23 and the seventh point P24 are located within the second area 13c. The distance from the first point P1 to the seventh point P24 is larger than the distance from the first point P1 to the sixth point P23. The resin layer 17 has a third thickness T23 at the sixth point P23 and a fourth thickness T24 at the seventh point P24.

FIG. 1C is a section taken along a reference plane R1, which is defined by the first ray RAY1 and a line normal to the principal surface 13a at the first point P1, and a reference plane R2, which is defined by the second ray RAY2 and a line NX1 normal to the principal surface 13a at the first point P1. The second ray RAY2 extends in a direction different from that of the first ray RAY1. The third surface 17c of the resin layer 17 has the convex surface as mentioned above. On the second ray RAY2, the thickness of the resin layer 17 monotonically changes from the third thickness T23 to the fourth thickness T24. The third thickness T23 is larger than the fourth thickness T24. In other words, a base point (the first point P1 in this embodiment) is defined within the first area 13b. An additional point (the second point P2 or the third point P3) is defined within the second area 13c. In addition, the first ray RAY1 or the second ray RAY2 is extended from the base point through the additional point. When the thicknesses of the resin layer 17 is measured at the different points on the first ray RAY1 or the second ray RAY2, the thickness T21 (T23) of the resin layer 17 at one of these points (the fourth point P21 on the first ray RAY1 or the sixth point P23 on the second ray RAY2) that is closer to the base point is larger than the thickness T22 (T24) of the resin layer 17 at the other point (the fifth point P22 on the first ray RAY1 or the seventh point P24 on the second ray RAY2) that is farther from the base point. As is understood from this description, the position of the base point within the first area 13b may be freely selected; and the positions of the additional points within the second area 13c may also be freely selected. The resin thickness at the points on each ray monotonically changes from the thickness at one of the points to the thickness at the other point. In the section illustrated in FIG. 1C, the shape of the upper surface (third surface) of the resin layer 17 allows incident light to the resin layer 17 through the second area 13c to be partially or entirely reflected so as to be directed toward the semiconductor mesa 19.

It has been demonstrated experimentally that dark current in a semiconductor light-receiving device having a mesa structure is reduced by decreasing the light-receiving area of the semiconductor light-receiving device. On the other hand, in general, a semiconductor light-receiving device that has a small light-receiving area has lower sensitivity than that of a semiconductor light-receiving device that has a large light-receiving area. In a semiconductor light-receiving device according to this embodiment, the light-receiving area of the optical absorption layer included in the semiconductor mesa 19 is small. However, this reduction in the light-receiving area does not result in proportional degradation of the sensitivity in the semiconductor light-receiving device. In a conventional semiconductor light-receiving device and a conventional light-receiving device array including a plurality of light-receiving devices arranged two-dimensionally, light that does not directly enter the optical absorption layer does not contribute to generation of photocurrent (photocarriers) and is not effectively used. In the semiconductor light-receiving device according to this embodiment, the optical absorption layer included in the semiconductor mesa 19 is designed so as to have a small area. Also, incident light to the resin layer 17 through the second area 13c of the substrate 13 does not directly enter the semiconductor mesa on the first area 13b. However, the incident light to the resin layer 17 is partially or entirely reflected by the surface (the third surface 17c) of the resin layer 17 so as to be directed to the semiconductor mesa 19. Accordingly, the dark current in the semiconductor light-receiving device is reduced by the reduction of the light-receiving area. In addition, a decrease in light-receiving sensitivity due to this reduction in the light-receiving area is suppressed. In an embodiment, the upper rim of the resin layer 17 is in contact with a side surface or an upper surface of the post 15, and a lower rim of the resin layer 17 is in contact with the substrate surface in the second area 13c. The first area 13b is defined by, for example, a circle having a diameter of 5 μm to 10 μm and a lower rim of the post 15 disposed on the first area 13b is not beyond the circumference of this first area 13b. The second area 13c is defined by, for example, a circle having a diameter of 25 μm to 30 μm and the lower rim of the resin layer 17 disposed on the second area 13c is not beyond the circumference of this second area 13c.

Example 1

FIGS. 3A to 3D and 4A to 4C are schematic views illustrating an example of a method for producing the semiconductor light-receiving device according to this embodiment. First, an n-type InP substrate is prepared. An n-type InP buffer layer, an optical absorption layer, an undoped InGaAs layer, a p-type InGaAs layer, and a p+-type InGaAs layer are sequentially grown on the n-type InP substrate by using a metal-organic vapor phase epitaxy (MOVPE) method or a molecular beam epitaxial growth (MBE) method so as to form an epitaxial wafer E. An example of the semiconductor layers grown on the n-type InP substrate will be described below.

n-type InP buffer layer: thickness of 0.5 μm

Optical absorption layer: undoped InGaAs/GaAsSb type-II multi quantum well (MQW) structure; InGaAs layer: thickness of 5 nm; GaAsSb layer: thickness of 5 nm; number of pairs of the InGaAs layer and the GaAsSb layer: 250 pairs Undoped InGaAs layer: thickness of 0.2 μm p-type InGaAs layer: thickness of 0.5 μm, impurity concentration of 1 to $3 \times 10^{18}$ cm$^{-3}$ p+-type InGaAs layer: thickness of 0.2 μm, impurity concentration of 1 to $3 \times 10^{19}$ cm$^{-3}$ An example of the n-type dopant is silicon (Si). An example of the p-type dopant is zinc (Zn) or carbon (C).

Figure 3A:
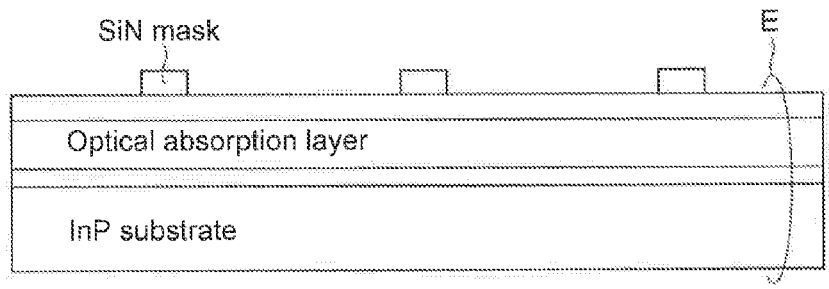
FIGS. 3A to 3D are schematic views illustrating an example of a method for producing a semiconductor light-receiving device according to an embodiment.

Referring to FIG. 3A, in the step of forming semiconductor mesas, a SiN mask having patterns for defining the semiconductor mesas is formed on the epitaxial wafer. The SiN mask includes the patterns for defining a two-dimensional pixel array of 320×256 pixels at a pixel pitch of 30 μm, for example. Each pattern for defining the semiconductor mesa has a diameter of 8 μm, for example. The mesa patterns are arrayed at a pitch of 30 μm in terms of center-to-center distance between SiN patterns.

Figure 3B:
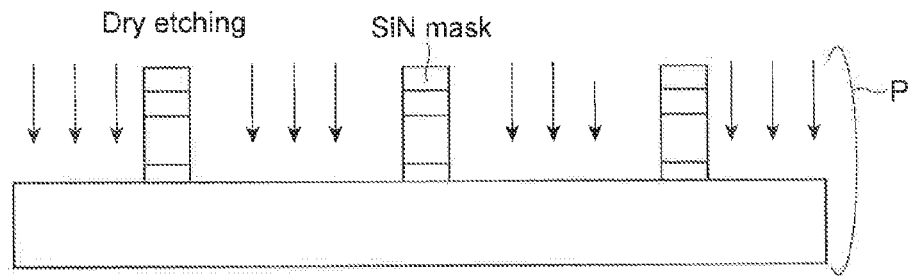

Subsequently, the epitaxial wafer E is etched through the SiN mask by a dry etching method. As a result of this etching, the semiconductor mesas each corresponding to a pixel are formed. Referring to FIG. 3B, a substrate product P including the semiconductor mesas is thus formed. This etching is performed at least to a depth such that the resultant semiconductor mesas have bottoms in the n-type InP buffer layer of the epitaxial wafer (the etching may be performed so as to reach the substrate). After the etching is completed, the SiN mask is removed.

In the step of forming a resin layer, the resin layer is formed by potting a resin at the positions of the arrayed semiconductor mesas. The resin layer is formed by using an inkjet method or a micro potting method. For example, droplets are formed for individual pixels with a micro nozzle by an inkjet method or a micro potting method.

Figure 5A:
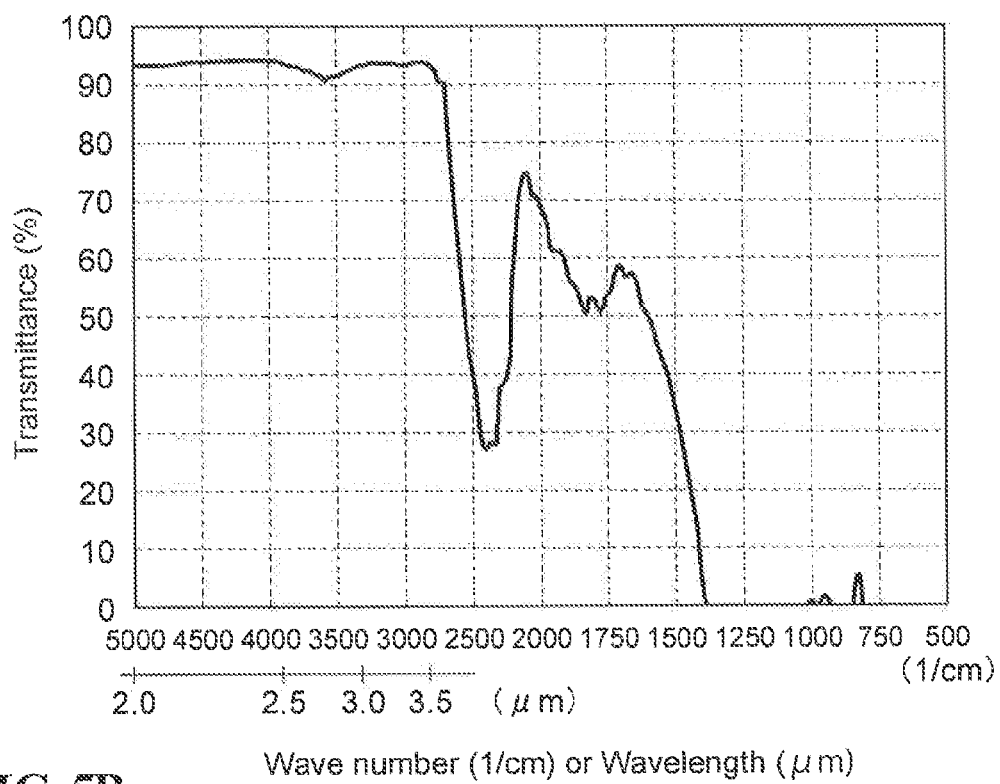
FIGS. 5A and 5B are graphs illustrating the transmittance of a fluororesin as an example.
Figure 5B:
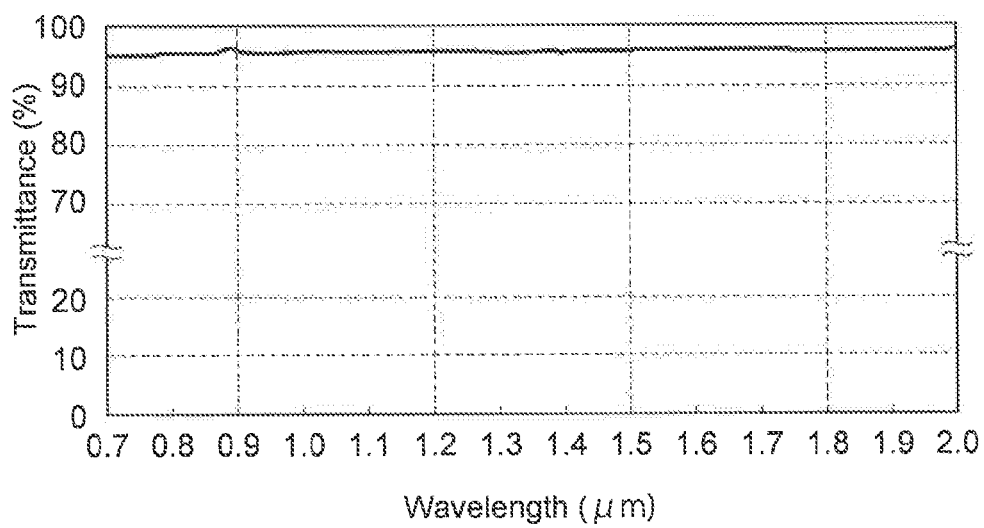

The resin layer is made of a fluororesin polymer, for example. In order to form droplets, a diluting medium such as ethanol, isopropyl alcohol/isobutyl acetate, or water is used. The fluororesin preferably includes an amorphous fluororesin that substantially transmits light in the predetermined wavelength region, and that mainly contains an alicyclic fluororesin without CH bond. Examples of the fluororesin include CYTOP and LUMIFLON (trade names, manufactured by Asahi Glass Co., Ltd.). These fluororesins transmit light of wavelengths in the range of 0.7 μm to 3 μm at transmittances of 70% or more and the range of fluctuation in each transmittance is 25% or less. FIGS. 5A and 5B are graphs illustrating the relationship between the transmittance of a typical fluororesin and the wavelength of light. FIG. 5A illustrates transmittance in terms of light of wavelengths of 2 μm or more. FIG. 5B illustrates transmittance in terms of light of wavelengths of 0.7 μm to 2 μm. FIGS. 5A and 5B illustrate the transmittance of CYTOP (trade name, manufactured by Asahi Glass Co., Ltd.) as a fluororesin. As illustrated in FIGS. 5A and 5B, the fluororesin has a transmittance of 95% in the wavelength range of 0.7 μm to 2.0 μm and has a transmittance of 93% in the wavelength range of 2.0 μm to 3.5 μm. In these wavelength ranges, no fluctuation in the transmittance of the fluororesin is substantially observed and the transmittance is substantially flat across the wavelength range.

When necessary, prior to the potting of the resin, a protective film that is made of, for example, a silicon nitride (SiN) film or a silicon dioxide ($SiO_2$) film is formed on the substrate by using a chemical vapor deposition (CVD) method. As a result, the side surfaces and upper surfaces of the semiconductor mesas and the semiconductor substrate are covered with the protective film. After that, a silane coupling agent is applied on the protective film. A photoresist is applied on the silane coupling agent to form a resist mask having openings only above the upper surfaces of the semiconductor mesas. Subsequently, the silane coupling agent on the upper surface of the semiconductor mesa is removed by using the resist mask. An opening of the silane coupling agent is formed on the upper surface of each of the semiconductor mesas. A top surface of the protective film disposed on the upper surface of the semiconductor mesa is exposed through the opening of the silane coupling agent. Then, the resin layer is formed on the protective film at the positions of the arrayed semiconductor mesas to form the droplets. In this case, the silane coupling agent is formed between the protective film and the resin layer in a region other than the upper surface of the semiconductor mesa. On upper surface of the semiconductor mesa, the resin layer is in direct contact with the protective film.

Figure 3C:
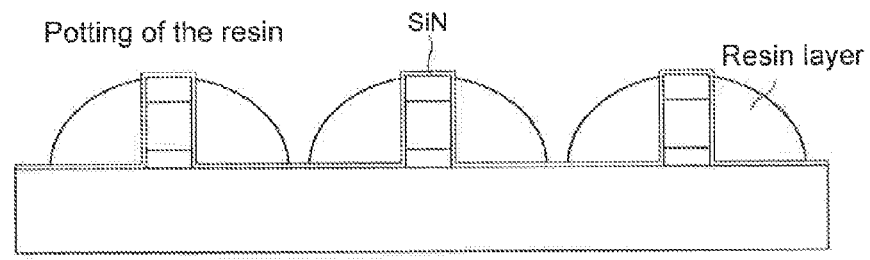

After the droplets are formed by potting the resin including the fluororesin, the arrayed droplets are heat-treated at 120° C. for 30 minutes. Referring to FIG. 3C, the heat treatment turns the droplets into an array of heat-treated resin portions (solidified resin layers). Each solidified resin layer is formed so as to be located at the semiconductor mesa. In addition, each solidified resin layer covers the upper surface and side surface of the corresponding semiconductor mesa. By adjusting the amount of resin dropped for individual posts of the semiconductor mesa, resin layers are formed so as to have substantially the same height as the mesas. Each resin layer has a surface that is gently inclined from the side surface of the mesa to the outside, in a direction from the center of the mesa to any direction. The heat-treated resin layer is formed so as to have a dome shape in which the upper surface of the semiconductor mesa is exposed. Specifically, the protective film on the side surfaces of the mesas and the bottom surfaces 13c on which the silane coupling agent is left are strongly bonded with the resin layer made of the fluororesin. On the other hand, the adhesion between the resin layer made of the fluororesin and the protective film is weak on the upper surfaces of the semiconductor mesas from which the silane coupling agent has been removed. The upper surfaces of the semiconductor mesas are exposed by selectively removing the resin layers on the upper surfaces of the semiconductor mesas using an ultrasonic cleaning treatment, for example.

Figure 3D:
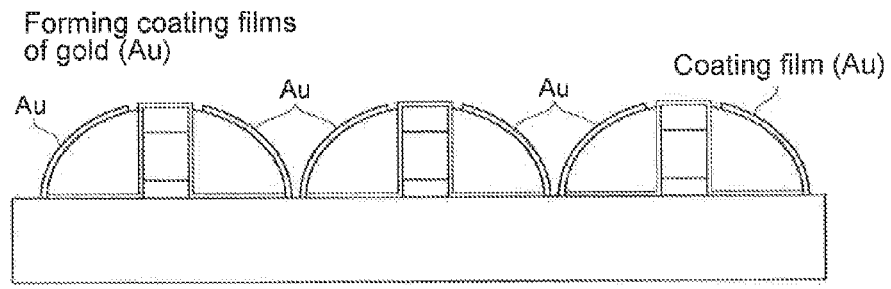

Subsequently, referring to FIG. 3D, coating films formed of a metal are formed on the resin layers formed of the fluororesin. The coating films are formed of gold (Au) or platinum (Pt), for example. Each coating film has a thickness of 10 nm or more, for example.

Figure 4A:
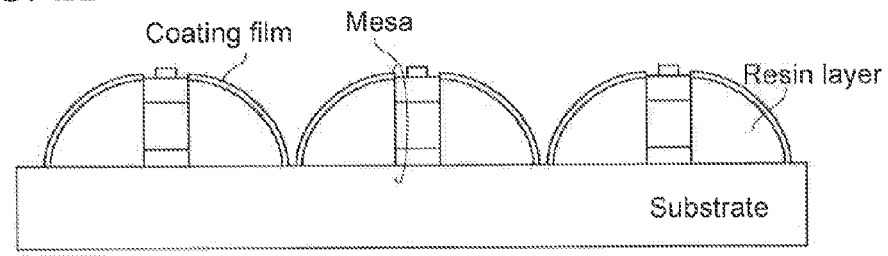
FIGS. 4A to 4C are schematic views illustrating an example of a method for producing a semiconductor light-receiving device according to an embodiment.
Figure 4B:
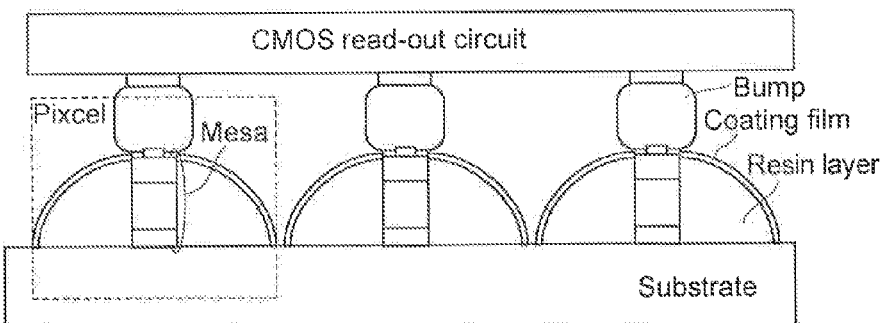
Figure 4C:
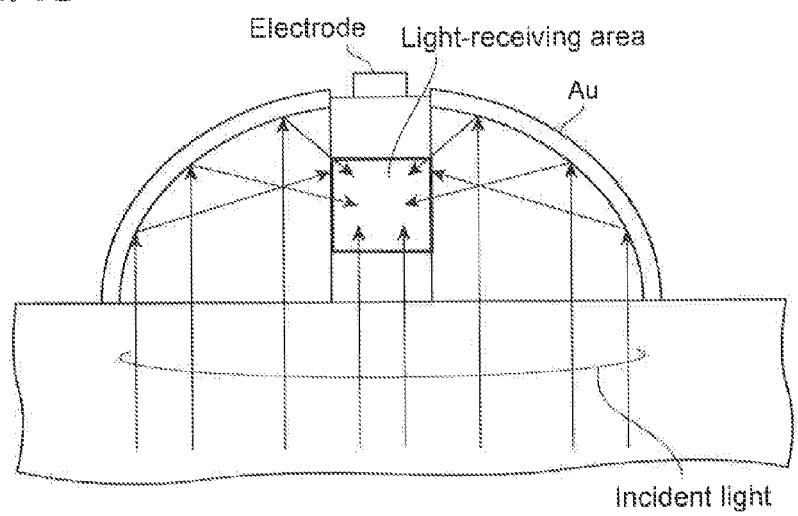

After the coating films are formed, the coating films and the protective film on the upper surfaces of the semiconductor mesas are etched through a resist mask to form openings in the protective film. Subsequently, first electrodes are formed in the openings of the protective film on the semiconductor mesas. A second electrode is formed on the back surface of the substrate. Thus, a semiconductor light-receiving device product is completed. The semiconductor light-receiving device product includes a large number of light-receiving device arrays that are two-dimensionally arranged. The semiconductor light-receiving device product is divided into chips each including a light-receiving device array in FIG. 4A. Referring to FIG. 4B, the light-receiving device array is connected to a complementary metal-oxide semiconductor (CMOS) read-out circuit through bumps. The thus-produced light-receiving device is housed in a package. As a result of the above-described steps, a sensor device is completed. Referring to FIG. 4C, in each of the light-receiving devices (photodiodes) included in this sensor device, reflection by the surface (coating film) of the resin layer increases the amount of light received.

In the sensor device including the light-receiving device array, each semiconductor mesa has a diameter of 8 μm. Aside from this sensor device, another light-receiving device array device including semiconductor mesas having a diameter of 20 μm is prepared. These two light-receiving device arrays are measured in terms of dark current. Compared with the light-receiving device array including semiconductor mesas having a diameter of 20 μm, a decrease in dark current by about 60% is observed in the light-receiving device array including semiconductor mesas having a diameter of 8 μm, the decrease being proportional to the decrease in the circumferential lengths of the mesas. Regarding sensitivity, light entering the resin layer outside the light-receiving area of the semiconductor mesa of each pixel, is reflected by the Au coating film and reaches the optical absorption layer of the semiconductor mesa. Because of this contribution, the sensitivity is maintained at the expected level. For example, in the light-receiving device array including semiconductor mesas having a diameter of 8 μm, a sensitivity to light of a wavelength of 1.5 μm is about 0.9 A/W. In this Example, the resin layers are formed of the fluororesin having a low optical absorption rate for near-infrared light. Accordingly, the amount of near-infrared light absorbed by the resin layers is very small. In addition, signal light reflected by the surfaces of the Au coating films reaches the optical absorption layers.

In this Example, each optical absorption layer includes an InGaAs/GaAsSb type-II multi quantum well (MQW) structure. Alternatively, the optical absorption layer may be formed of an InGaAs bulk material. In this case, the epitaxial wafer includes, for example, an n-type InP buffer layer (thickness: 0.5 μm), an undoped InGaAs optical absorption layer (thickness: 3 μm), a p-type InGaAs layer (thickness: 0.5 μm), and a p+-type InGaAs layer (thickness: 0.2 μm). These III-V group compound semiconductor layers are formed on an n-type InP substrate by a metal-organic chemical vapor deposition (MOCVD) method, for example.

The back-illuminated type light-receiving device according to this embodiment includes a semiconductor mesa including a stacked semiconductor layer. The stacked semiconductor layer includes an optical absorption layer and is grown on a semiconductor substrate. The back-illuminated type light-receiving device also includes a resin dome formed so as to surround the semiconductor mesa. When necessary, the light-receiving device may include a Au coating on the surface of the resin dome. In this light-receiving device, even when light entering a resin layer is reflected once by a Au coating but does not undergo photoelectric conversion by the optical absorption layer, the light is reflected twice or more times in total and undergoes photoelectric conversion by the optical absorption layer. This multiple reflection allows further enhancement of the sensitivity of the light-receiving device. In this light-receiving device, each resin dome has a surface curved in the direction from the bottom to the upper surface of the semiconductor mesa. A thin Au layer is formed on this curved surface. This Au layer reflects light and the reflected light enters the optical absorption layer. The resin forming the dome-shaped member preferably has a range of fluctuation of 25% or less in transmittance of light of wavelengths in the range of 0.7 μm to 3 μm. When the range of fluctuation in transmittance is 25% or less, light of any wavelength in this wavelength range uniformly reaches the optical absorption layer without depending on the wavelength of the incident light. As a result, the degree of dependence of sensitivity on wavelength is reduced. The transmittance of the resin forming the resin dome preferably has a transmittance of 70% or more and has a low absorption rate. Accordingly, a large amount of light reflected by the Au coating reaches the optical absorption layer. The sensitivity of the light-receiving device is improved. Preferably, a fluororesin is used as the resin, for example because the fluororesin has a low optical absorption rate for near-infrared light. In the light-receiving device, a silicon based inorganic insulating film is preferably formed between the resin dome and the semiconductor mesa. The silicon based inorganic insulating film includes a silicon nitride (SiN) film, a silicon oxy-nitride (SiON) film, or a silicon oxide ($SiO_2$) film, for example. This silicon based inorganic insulating film effectively serves as a protective film that protects the p-n junction exposed on the side surface of the semiconductor mesa. Covering the side surface of the semiconductor mesa with an insulating film of SiN or the like results in a further decrease in dark current. In addition, by covering the side surface of the semiconductor mesa with such an insulating film of SiN or the like, the semiconductor light-receiving device having high reliability is obtained.

Principles of the present invention have been described with reference to preferred embodiments and drawings. However, those skilled in the art understand that the present invention can be changed in arrangement and in details without departing from the principles. The present invention is not limited to the specific configurations disclosed in the embodiments. Therefore, the Claims and all the modifications and changes within the spirit of the Claims are claimed as the invention.

What is claimed is:

1. A semiconductor light-receiving device comprising:
    a substrate having a principal surface and a back surface opposite the principle surface, the principle surface including a first area and a second area surrounding the first area, and the back surface providing an incident surface for signal light entering the semiconductor light-receiving device;
    a post disposed on the first area of the substrate, the post including a semiconductor mesa having a side surface and including an optical absorption layer; and
    a resin layer disposed on the second area of the substrate in contact with a side surface of the post, the resin layer having a surface configured to reflect signal light passing into the resin layer from the incident surface to the side surface of the mesa.

2. The semiconductor light-receiving device according to claim 1, further comprising a metal layer formed on the surface of the resin layer.

3. The semiconductor light-receiving device according to claim 1, wherein the resin layer contains a material that transmits light of wavelengths in a range of 0.7 μm to 3 μm.

4. The semiconductor light-receiving device according to claim 1, wherein the resin layer contains a fluororesin.

5. The semiconductor light-receiving device according to claim 1, wherein the post includes an inorganic insulating film formed on the side surface of the semiconductor mesa.

6. The semiconductor light-receiving device according to claim 1, wherein the optical absorption layer includes an InGaAs/GaAsSb type-II multi quantum well structure or an InGaAs layer.

7. The semiconductor light-receiving device according to claim 1, wherein the surface of the resin layer configured to reflect signal light has a height which is substantially the same as a height of the mesa.

8. The semiconductor light-receiving device according to claim 1, wherein
    the resin layer has on a ray extending from a first point within the first area through a second point within the second area, a first thickness and a second thickness respectively at a third point and a fourth point that are located on the ray within the second area at different distances from the first point,
    the distance from the first point to the fourth point is larger than the distance from the first point to the third point,
    the first thickness at the third point is larger than the second thickness at the fourth point, and
    the resin layer surface configured to reflect signal light monotonically changes from the first thickness to the second thickness, in a section of the resin layer, the section being defined by a reference plane that passes through the ray and extends along an axis normal to the principal surface of the substrate.

9. The semiconductor light-receiving device according to claim 1, wherein the resin layer surface configured to reflect signal light has a shape that reflects the signal light entering the resin layer through the substrate incident surface to the side surface of the semiconductor mesa.

10. The semiconductor light-receiving device according to claim 9, wherein the shape is a dome shape.

11. A semiconductor light-receiving device array comprising:
    a substrate having a principal surface and back surface opposite the principle surface;
    a plurality of semiconductor light-receiving devices arranged two-dimensionally on the principal surface of the substrate, the back surface of the substrate providing an incident surface for signal light entering each semiconductor light-receiving device; and a device isolation region disposed among the semiconductor light-receiving devices, the device isolation region separating the semiconductor light-receiving devices from each other, wherein each of the semiconductor light-receiving devices includes:

first and second areas in the principal surface of the substrate with the second area surrounding the first area;

a post disposed on the first area, the post including a semiconductor mesa having a side surface and including an optical absorption layer; and a resin layer disposed on the second area in contact with the post, the resin layer having a surface configured to reflect signal light passing into the resin layer from the incident surface to the side surface of the semiconductor mesa.

12. The semiconductor light-receiving device array according to claim 11, wherein the resin layer surface configured to reflect signal light has a height which is substantially the same as a height of the mesa.

13. The semiconductor light-receiving device array according to claim 11, further comprising a metal layer formed on the surface of the resin layer.

14. The semiconductor light-receiving device array according to claim 11, wherein the resin layer contains a material that transmits light of wavelengths in a range of 0.7 μm to 3 μm.

15. The semiconductor light-receiving device array according to claim 11, wherein the resin layer contains a fluororesin.

16. The semiconductor light-receiving device array according to claim 11, wherein the post includes an inorganic insulating film formed on the side surface of the semiconductor mesa.

17. The semiconductor light-receiving device array according to claim 11, wherein the optical absorption layer includes an InGaAs/GaAsSb type-II multi quantum well structure or an InGaAs layer.

18. The semiconductor light-receiving device array according to claim 11, wherein, in at least one of the semiconductor light-receiving devices, the resin layer has, on a ray extending from a first point within the first area through a second point within the second area, a first thickness and a second thickness respectively at a third point and a fourth point that are located on the ray within the second area at different distances from the first point, the distance from the first point to the fourth point is larger than the distance from the first point to the third point, the first thickness at the third point is larger than the second thickness at the fourth point, and the resin layer surface configured to reflect signal light monotonically changes from the first thickness to the second thickness, in a section of the resin layer, the section being defined by a reference plane that passes through the ray and extends along an axis normal to the principal surface of the substrate.

19. The semiconductor light-receiving device array according to claim 11, wherein the surface of the resin layer configured to reflect signal light has a shape that reflects the signal light entering the resin layer through the substrate incident surface to the side surface of the semiconductor mesa.

20. The semiconductor light-receiving device array according to claim 19, wherein the shape is a dome shape.

* * * * *